(12) United States Patent
Zhang

(10) Patent No.: US 6,433,605 B1
(45) Date of Patent: Aug. 13, 2002

(54) LOW WIRING SKEW CLOCK NETWORK WITH CURRENT MODE BUFFER

(75) Inventor: Johnny Q Zhang, San Jose, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/497,093

(22) Filed: Feb. 3, 2000

(51) Int. Cl.$^7$ .............................. G06F 1/04; H03K 3/00
(52) U.S. Cl. ..................... 327/291; 327/112; 326/83; 330/253
(58) Field of Search ............................. 327/52, 54, 55, 327/57, 65, 67, 77, 80, 112, 291, 299; 326/83, 115; 330/253

(56) References Cited

U.S. PATENT DOCUMENTS 5,504,782 A * 4/1996 Campbell, Jr. ............... 375/259
5,510,745 A * 4/1996 Hamano et al. ............. 327/333
5,898,326 A * 4/1999 Okayasu ...................... 327/112

FOREIGN PATENT DOCUMENTS

| JP | 4-207226 | * | 7/1992 |
| JP | WO98/38739 | * | 9/1998 |

\* cited by examiner

Primary Examiner—Terry D. Cunningham
Assistant Examiner—Quan Tra

(57) ABSTRACT

A clock circuit on an integrated circuit chip includes a driver having an output for deriving an output clock wave responsive to a clock wave of a clock wave source, a clock line having a first end coupled to the output of the driver, and a receiver having an input coupled to a second end of the clock line. The receiver has a resistive input impedance causing the clock line carrying the output clock wave to the input of the receiver to present to the driver output an impedance having a resistance-capacitance time constant that is a relatively small fraction of a period of the clock wave.

55 Claims, 2 Drawing Sheets

LOW WIRING SKEW CLOCK NETWORK WITH CURRENT MODE BUFFER

FIELD OF THE INVENTION

The present invention relates generally to integrated circuit clock circuitry and more particularly to such clock circuitry including a receiver having an input impedance causing a wire carrying a clock wave to the receiver to present to a driver an impedance having a resistance-capacitance (RC) time constant that is a relatively small fraction of a cycle of the clock wave.

BACKGROUND OF THE INVENTION

An integrated circuit (IC) chip frequently includes clock trees to distribute clock waves to physically separated destination (i.e., receiver) circuits. Typically, an off-chip, external clock source provides clock waves to a plurality of clock tree branches or segments resident on the IC chip. Each branch or segment of the clock tree carries clock waves to a respective one of the physically separated destination circuits.

Ideally, the clock waves delivered by any given branch arrive at the associated destination circuit in synchronism or in phase with the other clock waves arriving at their respective destination circuits. In this way, synchronism is maintained across the entire integrated circuit chip. In such an ideal case, the respective clock waves are said to exhibit zero clock skew at the various destination circuits. The term "clock skew" represents the relative time delay between corresponding clock waves as they exit their respective branches. For example, the clock skew between two branches of the clock tree is the time delay between the rising edges of corresponding clock waves exiting the two branches.

Although the ideal clock tree delivers clocks with zero skew, in reality, there are many factors that adversely affect, i.e., increase, clock skew in an IC chip, to prevent zero clock skew from being obtained throughout the chip. One factor is material processing variations inherent to the IC chip fabrication process; chip components can only be fabricated to predetermined tolerances so that different nominally identical components at different locations on the chip have different characteristics. Other factors include power supply and temperature variations across the chip. Since large IC chips are susceptible to both spatial and temporal variations in localized temperature and power supply voltage while operating, and since chip component characteristics and behavior are influenced by such variations, clock skew correspondingly varies both spatially and temporally across the chip. As the size of an IC chip increases, the variability of these factors and thus the variability of clock skew, worsens.

Large IC chips require clock lines of relatively long length to carry clock waves throughout the chip. In large chip applications, these relatively long clock lines and the delays they introduce, as well as the other factors affecting clock skew described previously, combine to exacerbate clock skew. In addition, the requirement to operate IC chips at high frequency (e.g., at 500 MHz or more), further requires tight control and clock skew minimization. Thus, an important challenge presented by increasing IC chip size and clock operating frequency is that of controlling clock skew to within acceptable tolerances.

FIG. 1 is a circuit diagram of a conventional clock tree distribution segment for distributing clock waves on an IC chip carrying the segment. The circuit of FIG. 1 is on an IC chip and includes spaced clock wave driver 4 and clock wave receiver 6 as well as wire or clock line 2 that is connected between the driver and receiver. Driver 4 usually responds to clock waves in the form of a sequence of clock pulses derived from a clock source (not shown) that is not on the IC chip. Driver 4 derives at output terminal 10 a sequence of amplified clock waves in the form of clock pulses. Terminal 10, at the junction of the drains of complementary field effect transistors 11 and 13 having gates driven in parallel by the clock pulses from clock input 12, is connected to a first end of single ended line 2 to supply the derived clock pulses to the first end of the clock line. The clock waves traverse clock line 2 and exit at a second end thereof to be injected into input terminal 14 of clock wave receiver 6.

Receiver 6 includes complementary FETs 17 and 19 having gates driven in parallel by the pulses at terminal 14 of line 2 and drains connected to a common terminal 16, where the output is derived. The FETs of driver 4 and receiver 6 are connected across power supply rails connected to DC power supply terminals +Vdd and ground so the sources of N-channel FETs 11 and 17 are grounded and the sources of P-channel FETs 13 and 19 are at +Vdd; in the typical prior art circuit, Vdd=3 Volts. The clock pulses propagating along line 2 are attenuated because of the substantial impedance of the line, are phased delayed because of the substantial resistance-capacitance (RC) time constant of the line, and are subject to noise on the line which is coupled to terminal 14. Receiver 6 responds to the degraded clock pulses at terminal 14 to amplify the pulses almost to the rail-to-rail voltages +Vdd and ground.

When a plurality of conventional clock tree distribution segments of the type illustrated in FIG. 1 distribute clocks across an IC chip, clock skew problems arise between the various clock distribution segments. One reason these conventional circuits contribute to clock skew is because they inherently impart large time delays to the clock waves. Since these circuits themselves introduce in part large time delays to the clock waves, even small changes or variations in this large delay, as between the various clock tree segments, contribute significantly to an increase in clock skew. These changes in the delay between the various clock segments arise as a result of small variations in operating characteristics and behavior of the individual components comprising the individual clock segments.

The following example serves to illustrate this point. Referring again to the conventional clock circuit of FIG. 1, assume that clock line 2 and input terminal 14 of receiver 6 together present an input impedance to output 10 of driver 4 on the order of several hundred ohms, due primarily to the high gate-source impedance FET receiver 6 presents to terminal 14 and the driver 4 output impedance, as well as the impedance of line 2. Typically, clock line 2 presents a capacitive load of approximately 2 pico farads (pF) to output terminal 10 of driver 4. With these exemplary assumptions, a typical RC time constant of approximately several hundred picoseconds is presented to the clock pulses at output terminal 10 of driver 4. In an integrated circuit chip operating at a frequency of, for example, 1 GHz, which translates to clock periods or cycles on the order of 1 nanosecond (ns), the several hundred ps time delay introduced by the conventional clock circuit of FIG. 1 represents a considerable portion of each half cycle pulse of each clock period. Thus, small changes in delay times between clock segments, due to the factors discussed previously, can cause clock skew of a considerable portion of one clock cycle. Clearly, for IC chips operating at high frequencies wherein clock synchronization across the chip is required, such clock skew is disadvantageous and the conventional clock circuit of FIG. 1 has substantial problems in controlling clock skew to within acceptable tolerances.

Although the foregoing approximation serves as a useful example to illustrate the adverse effect of the large interconnect delay of the circuit of FIG. 1 on clock skew, characterizing the RC delay on the interconnect mathematically is useful for comparative purposes. The following generalized equation, Equation (1), characterizes the total RC delay time (Delay) of clock line 2 between driver 4 and receiver 6

$$Delay = \frac{R\,int\,C\,int}{2}\left(\frac{Rdr + R\,int/3 + Rcvr}{Rdr + Rrcv + R\,int}\right) + RdrC\,int\left(\frac{Rcvr}{Rdr + R\,int + Rcvr}\right) \quad \text{Eq. (1)}$$

In Equation (1), Rdr represents the resistive output impedance of driver 4, Rint represents the resistive impedance of clock line 2 seen by looking from the first end of the line into the line with a second end of the line connected to the line characteristic impedance, Rrcv represents the resistive input impedance of receiver 6 as seen by looking from terminal 4 into the gates of FET 17 and 19, and Cint represents the capacitive impedance of the clock line seen by looking from the first end of the line into the line with a second end of the line connected to the line characteristic impedance.

In the conventional clock circuit of FIG. 1, Rrcv is on the order of megaohms, whereby Rrcv>>Rint and Rdr to enable Equation (1) to be approximated as follows:

$$Delay = \frac{R\,int\,C\,int}{2}\left(1 + \frac{2Rdr}{R\,int}\right) \quad \text{Equation (2)}$$

Having established RC delay for the conventional circuit, as represented in Equation (2), it then follows that the skew due to variations in Rint and Cint due to the variable factors discussed previously, such as material processing, power supply voltage and temperature variations, can be expressed as:

$$Skew = \frac{\delta(R\,int)C\,int}{2}\left(\frac{2\,Rdr}{R\,int}\right) \quad \text{Equation (3)}$$

Equation 3 assumes that the product Rint*Cint is a constant, which is generally the case.

Since the denominator term, Rint, in Equation 3 is a relatively small quantity, e.g., a few ohms, compared to the product of the terms in the numerator, skew in the conventional circuit is relatively large. The conventional clock circuit of FIG. 1 is generally characterized as a voltage mode interconnection or clock circuit because of the very high gate source input impedance of FET receiver 6, the receiver being primarily responsive to voltage swings at its input. Thus, Equations (2) and (3) respectively characterize the relatively large RC time delay and corresponding clock skew for the conventional voltage mode interconnection or clock circuit of FIG. 1.

One solution proposed in the prior art for controlling skew is to provide driver and receiver pairs that operate at higher current and power levels. However, this approach causes large current switching transients to substantially increase power dissipation and noise on DC power supply lines. Consequently, operating at higher current and power levels has substantial disadvantages. In summary, there is a need to reduce and control clock skew in clock distribution networks on IC chips without substantially increasing power dissipation or introducing undue switching noise on the IC chip.

Clock circuitry on the IC chip is subject to noise and problems associated therewith. Particularly, noise is introduced onto the single ended clock line coupled between the single ended driver and single ended receiver pair associated with that clock line. The amount of noise coupled to clock lines increases with increases in IC chip size, since the clock lines are necessarily longer in the larger chips.

In the conventional, prior art clock circuit of FIG. 1, noise introduced onto clock line 2 corrupts the integrity of the clock pulses propagating between driver 4 and receiver 6. Since receiver 6 is not inherently immune to noise and does not provide noise correction or elimination, clock line noise arriving at input terminal 14 of receiver 6 is simply coupled to the output of receiver 6, and/or the noise translates to clock jitter at the receiver output terminal 16. Clock pulses with substantial noise components superimposed thereon arrive at destination circuits a responsive to the output of receiver 6. Under such conditions, the destination circuits of the IC chip usually do not have optimum performance. Thus, there is a need to eliminate or substantially reduce the effects of noise introduced onto the clock lines between the driver and receiver of a clock circuit, to provide a substantially noise free clock wave to a destination circuit on the IC chip.

In summary, there is a need to provide IC chip clock circuitry that both reduces clock skew and/or minimizes the deleterious effects caused by noise coupled onto clock lines in the chip. There is a further need to achieve these goals in the environment of large IC chips operating at high frequencies.

SUMMARY OF THE INVENTION

It is accordingly an object of the present invention to provide new and improved integrated circuit clock circuitry having reduced clock skew.

A further object of the present invention is to provide a new and improved clock circuit for reducing clock skew on an IC chip operating at high clock wave frequencies.

An additional object of the present invention is to provide new and improved clock circuitry arranged to minimize the deleterious effects caused by noise coupled onto clock lines in an IC chip.

In one aspect of the present invention, a clock circuit on an IC chip includes a driver having an output for supplying an output clock wave to a receiver via a clock line, wherein the receiver has a resistive input impedance causing the clock line to present to the driver output an impedance having a resistance-capacitance (RC) time constant that is a relatively small fraction of a period of the clock wave.

In another aspect of the present invention, the receiver includes a shunt impedance coupled between an output terminal of the clock line and a DC power supply line, wherein the shunt impedance has a resistance approximately equal to an output resistance of the driver. The receiver also includes a current source arranged to supply current to the shunt impedance and through the clock line to an output impedance of the driver. This arrangement causes the resistance seen by the driver looking into the line to be relatively low, to enable the RC time constant seen by the driver to be a relatively small fraction of a period of the clock wave.

In a further aspect of the present invention, the driver includes a first transistor having a first current path and an impedance connected between the driver output terminal and a first power supply line. The first transistor includes a first control electrode responsive to the clock wave of the clock wave source for controlling the impedance of said first current path. The receiver shunt impedance includes a first device, configured as a diode, and connected between the line output terminal and the first DC power supply line. The first device is respectively conducting and non-conducting responsive to a clock wave voltage at the input of the receiver having relatively high and low levels. The receiver includes a second device, configured as a diode, and connected between an output terminal of the receiver and the second power supply line. The second device is respectively conducting and non-conducting responsive to a voltage at the receiver output terminal having relatively low and high levels relative to the first power supply line. The receiver further includes a second transistor having a second current path and an impedance connected in parallel with the second device. The second transistor includes a second control electrode for driving the impedance of the second current path relatively high and low when the second device is respectively conducting and non-conducting. The receiver includes a third device, configured as a current source, and connected between the input and the output of the receiver. The third device includes a control terminal for controlling the current the third device supplies to the shunt impedance.

The above and still further objects, features and advantages of the present invention will become apparent upon consideration of the following detailed description of several specific embodiments thereof, especially when taken in conjunction with the accompanying drawings.

BRIEF DESCRIPTION OF THE DRAWING

As described.

DETAILED DESCRIPTION OF THE DRAWING

Figure 2:
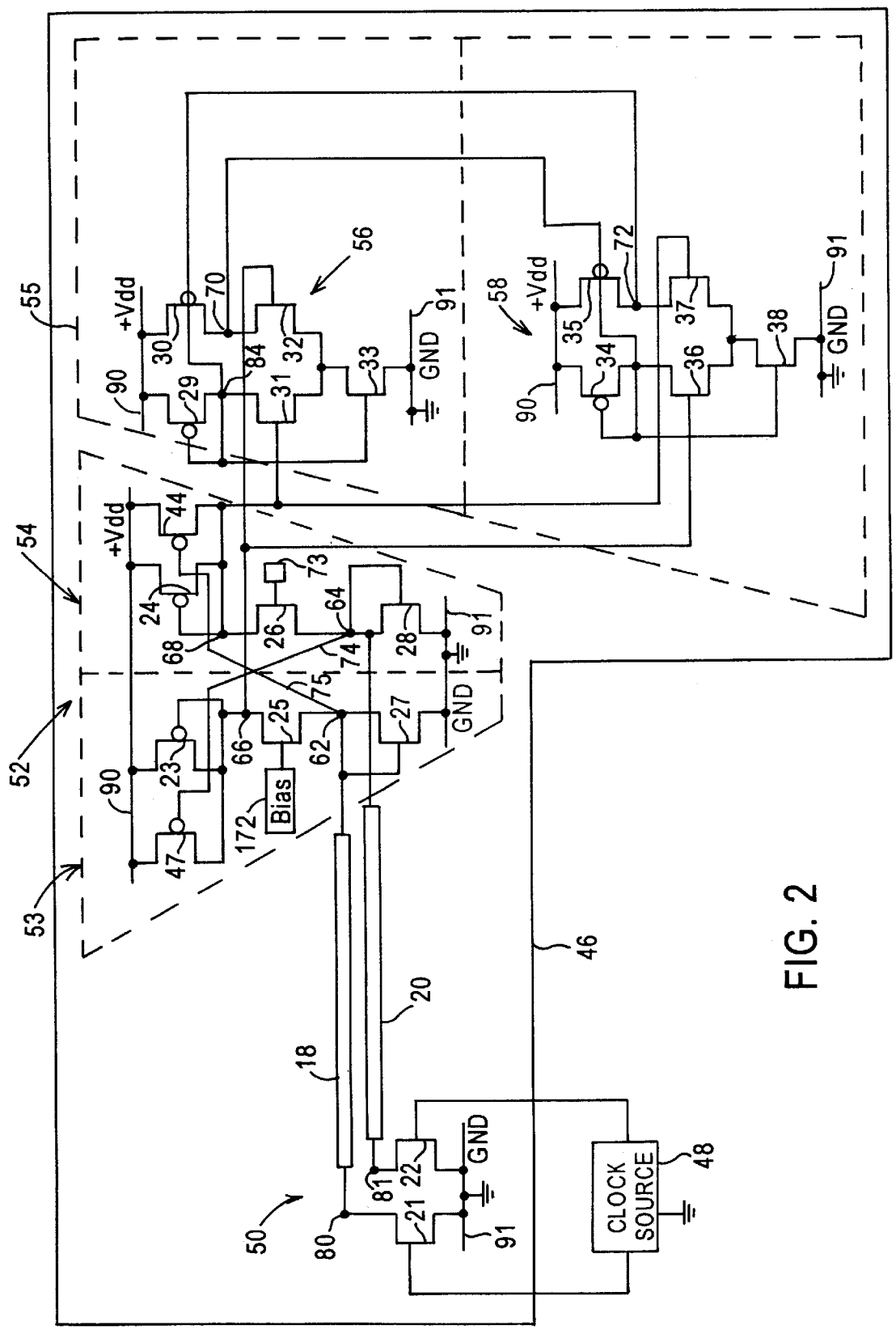
FIG. 2 is circuit diagram of an embodiment of a clock circuit on an IC chip in accordance with the present invention.

FIG. 2 is a circuit diagram of CMOS clock circuitry carried by integrated circuit chip 46; the clock circuitry illustrated in FIG. 2 distributes clock pulse trains to other circuitry (not shown) on the integrated circuit chip. The clock circuitry of FIG. 2 responds to clock pulse trains derived from clock pulse source 48, which is usually not on integrated circuit chip 46, but is connected to the clock circuitry on the chip by terminals (not shown) of the chip. Clock source 48 supplies complementary clock pulse trains to the clock circuitry on integrated circuit chip 46. A typical frequency for the clock pulse train source 48 supplies to the circuitry on chip 46 is one GHz, although the illustrated clock circuitry can operate in response to other clock frequencies which are higher and lower than one GHz.

The integrated clock circuitry of FIG. 2 on chip 46 includes clock pulse driver 50 and clock pulse receiver 52, spaced from each other and connected to each other by clock lines 18 and 20. Chip 46 also includes amplifier 55, which responds to relatively low amplitude clock pulse waves derived by receiver 52 to amplify these waves substantially to DC voltages at positive rail 90 and ground (i.e., negative) rail 91 of a DC power supply source driving the integrated circuits on chip 46.

Driver 50 responds to the complementary clock pulse trains supplied to it by clock source 48 to supply complementary clock pulse trains to lines 18 and 20, thence receiver 52. Lines 18 and 20 are arranged as described to be responsive to common mode noise, i.e., noise having the same polarity and substantially the same amplitude. Receiver 52 responds to the complementary clock pulse-like trains supplied to it by lines 18 and 20 to drive amplifier 55, which is arranged to eliminate the common mode noise. Amplifier 55 derives complementary clock pulse wave trains that are substantial replicas of the clock pulse trains source 48 applies to driver 50. Leading and trailing edges of the clock pulse trains derived by amplifier 55 occur at substantially the same times as leading and trailing edges of the clock pulse trains source 48 applies to driver 50.

Figure 1:
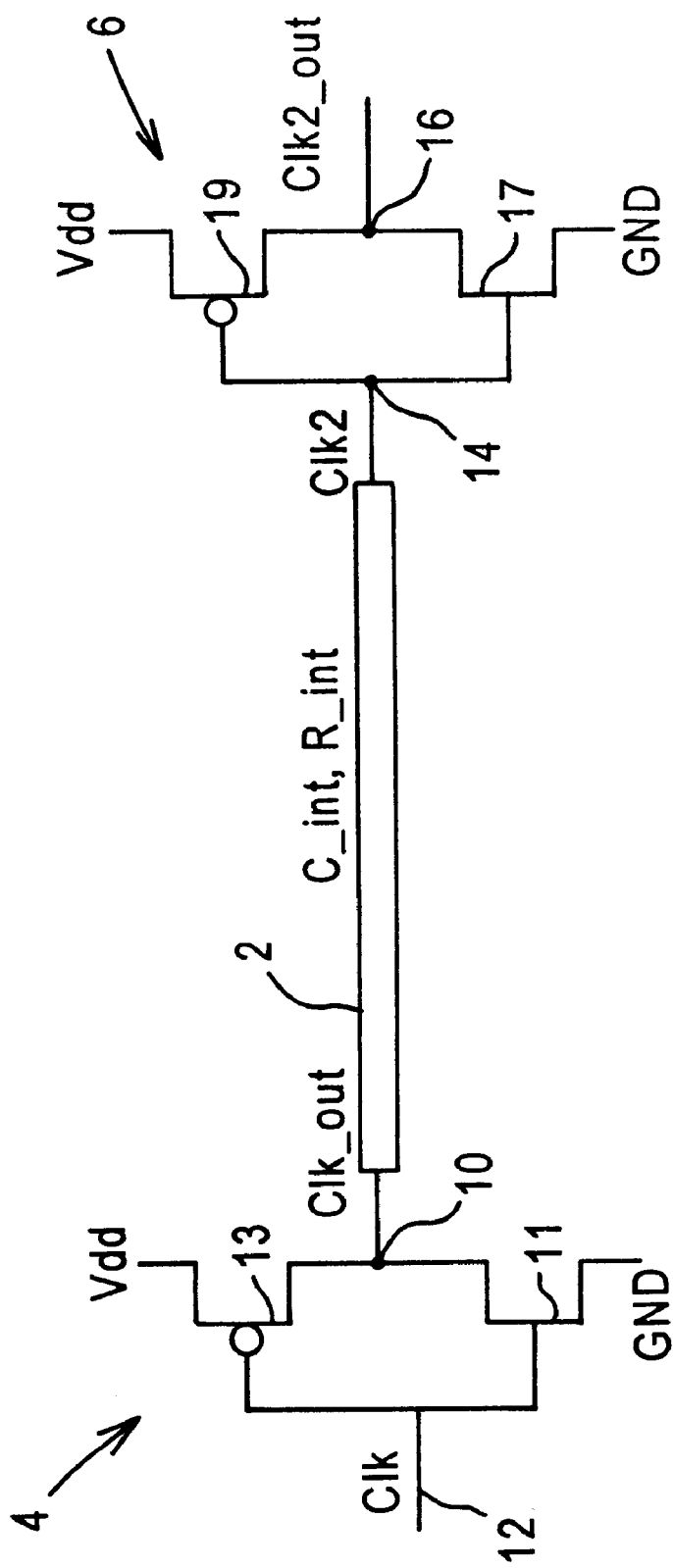
FIG. 1 is a circuit diagram of a conventional clock circuit on an IC chip.

The elimination of noise from the clock pulse trains derived by amplifier 55 of the circuit of FIG. 2 is in contrast to the single ended arrangement of FIG. 1 wherein the output of receiver 6 is subject to substantial noise variations on line 2. Because of the high frequency, such as one GHz, that clock pulse train source 48 derives and the low DC power supply voltage (such as 1.3 volts) driving the circuitry of FIG. 2, the noise on lines 18 and 20 is likely to introduce (1) frequency components that are about the same as the clock frequencies, and (2) amplitude variations that are about the same as the DC power supply voltage. The complementary arrangement of driver 50, wires or leads 18 and 20, receiver 52 and amplifier 55 substantially eliminates these common mode noise components and variations from the receiver clock pulse wave trains.

Driver 50, receiver 52 and clock lines 18 and 20 cause a much lower clock skew to be introduced than is introduced by the circuitry of FIG. 1 by presenting to the output of driver 50 an impedance having an RC time constant that is a relatively small fraction (e.g., about 10%) of the duration of a cycle of the clock wave propagating along clock lines 18 and 20. The substantial reduction in the RC time constant presented to the output of driver 50 is attained by substantially decreasing the effective resistive input impedance, Rrcv, of receiver 52 without decreasing the amplitude of the clock pulse wave trains driver 50 derives.

In the prior art clock circuitry of FIG. 1, receiver 6 has a high resistive input impedance, Rrcv, between terminal 14 and ground; the value of Rrcv between terminal 14 and ground is typically on the order of a megohm. In contrast, receiver 52 presents to driver 50 a resistive input impedance in the range of approximately 10 to 60 ohms. The drastically reduced resistive input impedance that receiver 52 and lines 18 and 20 present to driver 50, compared to the impedance line 2 presents to driver 4 (FIG. 1), enables the circuit of FIG. 2 to have a substantial reduction in clock skew compared to the circuit of FIG. 1. Because of the low resistive impedance receiver 52 presents to lines 18 and 20, lines 18 and 20 present to driver 50 an RC time constant on the order of about 100 picoseconds (ps); this is in contrast to the approximately one microsecond RC time constant line 2 presents to driver 4. Hence, the RC time constant presented to the output terminals of driver 50 is a relatively small fraction (such as 10%) of the period of one cycle of the clock pulse wave train source 48 derives. Because lines 18 and 20 and receiver 52 present a short RC time constant to the output terminals of driver 50, substantial variations in the resistance and capacitance of the impedance seen by the driver do not have a substantial effect on the time displacement between the leading and trailing edges of the clock wave trains source 48 and amplifier 55 derive.

It is desirable for the resistive input impedance of receiver 52 to be at least 10 ohms to prevent oscillations that would otherwise occur. The oscillations would occur if the resistive input impedance were less than 10 ohms because clock lines 18 and 20 have capacitive and inductive reactances tending to cause oscillations on the lines in response to leading and trailing edge transitions of the clock pulses propagating along the lines. A resistive input impedance of about 10 ohms or larger is sufficiently large to substantially dampen such oscillations.

Driver 50 includes N-channel field effect transistors (FETs) 21 and 22 having source drain paths respectively connected between output terminals 80 and 81 of the driver and a terminal connected to ground rail 91, i.e., the low DC power supply voltage, applied to the clock circuitry of chip 46. FETs 21 and 22 include gates connected in DC circuits to the complementary outputs of clock pulse wave train source 48. FETs 21 and 22 invert the complementary clock waves source 48 derives so that when the input clocks to the gates of FETs 21 and 22 are respectively high and low, the voltages at the drains of FETs 21 and 22 are respectively low and high, and vice versa. Clock pulse trains at output terminals 80 and 81 are respectively injected into first ends of clock lines 18 and 20.

Clock lines 18 and 20 extend along substantially parallel, closely spaced paths between output terminals 80 and 81 of driver 50 to input terminals 62 and 64 of receiver 52. If one of clock lines 18 and 20 has a length of about 400 micrometers, as is typical, it presents to one of terminals 80 and 81 typical resistive and capacitive values of about 5 ohms and two picofarads respectively. Because lines 18 and 20 run substantially parallel and in close proximity to each other, localized, common mode noise on integrated circuit chip 46 is coupled to both lines. The common mode noise coupled to clock lines 18 and 20 is substantially reduced and is virtually eliminated at output terminals 70 and 72 of amplifier 55.

Each of lines 18 and 20 has a second end respectively connected to input terminals 62 and 64 of receiver 52. Receiver 52 includes first and second input buffers 53 and 54, respectively responsive to the clock pulses at terminals 62 and 64 at the second ends of lines 18 and 20.

Buffers 53 and 54 are identical to each other, but are responsive to the complementary clock pulse trains at terminals 62 and 64. Hence, a description of buffer 53 suffices for buffer 54. Because of the complementary nature of the clock pulses driving buffers 53 and 54, buffer 53 derives a relatively low voltage output clock wave at its output terminal 66 while buffer 54 derives a relatively high voltage output wave at its output terminal 68 and vice versa.

Buffer 53 includes N-channel FET 27, connected as a back biased diode between terminal 62 and ground, by virtue of its gate and drain (which form the diode cathode) being connected together at terminal 62 and its source (which forms the diode anode) being connected to ground rail 91. The diode formed by FET 27 assists in preventing the voltage at terminal 62 from (1) dropping below a predetermined value, e.g., about 300 millivolts, and (2) going above a predetermined value, e.g., about 500 millivolts. The voltages at terminal 62 are thus approximately 500 millivolts and approximately 300 millivolts while the source drain impedance of FET 21 is relatively high and low, respectively.

DC current is supplied to terminal 62 and the diode formed by FET 27 by N-channel field effect transistor 25 having a source drain path connected between terminals 62 and 66 such that the drain and source of FET 25 are respectively connected to terminals 62 and 66. DC source 172 biases the gate of FET 25 relative to the source of the FET to control the amplitude of the DC current FET supplies to terminal 62. DC bias source 172 is preferably a tap on a capacitive voltage divider (not shown) connected between positive DC power supply rail 90 and ground rail 91. The bias voltage DC bias source 172 applies to the gate of FET 25 maintains the FET in a forward biased conducting state throughout the operation of the clock circuitry on integrated circuit chip 46.

FET 25 has a relatively high transconductance, $g_m$, a result achieved by forming FET 25 so it has a relatively wide gate width, i.e., a gate width that is about 5 to 10 times the width of the gates of any of FETs 21,27 or 47. As a result of the high $g_m$, the source drain path of field effect transistor 25 can be considered as a constant DC current source for any particular value of its source gate bias voltage, i.e., the difference in voltage between terminal 62 and the bias voltage source 172 supplies to the gate of FET 25.

DC current for the source drain path of FET 25 is derived from the positive DC power supply voltage at rail 90 via the source drain path of at least one of P-channel FETs 23 and 47. FET 23 is connected as a diode in shunt with the source drain path of FET 47 since the gate and drain of FET 23 have a common connection to terminal 66 to form the diode anode. The source of FET 23 is connected to the positive DC power supply voltage at rail 90 to form the diode cathode.

The source drain path of FET 47 is connected in parallel with the diode formed by FET 23 because the source and drain of FET 23 are respectively connected to rail 90 and terminal 66. The gate of FET 47 is connected to terminal 64 to be responsive to voltage variations resulting from the clock pulse wave train on lead 20. Hence, the source drain impedance of FET 47 is high while the source drain impedance of FET 22 is high while clock source 48 derives the low level clock half cycles. Because of the parallel connections of FETs 23 and 47 to the drain of FET 25, a substantial DC current flow is always provided through at least one of FETs 23 or 47 to the source drain path of FET 25. The amplitude of the current is controlled by the transconductance and the source gate voltage of FET 25. Because of the shunt impedance of the diode formed by FET 27, which is in shunt (for AC purposes) with the series combination of the source drain paths of FET 25 and at least one of FETs 23 or 47, there is a relatively low resistive impedance (e.g., 10–60 ohms) between terminal 62 and ground for the high frequency components of the clock pulse wave driver 50 applies to line 18 via terminal 80. Hence, the clock pulses that driver 50 supplies to terminal 80 drive a load having a short RC time constant, typically about 100 picoseconds. The previously mentioned advantages of such a short time constant are thus realized by the described circuit. Also, as previously mentioned, a resistive input impedance of receiver 52, i.e., the resistance between terminal 62 or 64 to ground, in the approximate range of 10 ohms or larger advantageously prevents the occurrence of oscillations.

Buffer 54, being constructed the same as buffer 53 but driven by clock pulses that are complementary to the clock pulses that drive buffer 53, responds to the high and low impedance states of FET 22 in the same way buffer 53 responds to the impedance states of FET 21, but at opposite times during the half cycles of clock source 48.

In operation, source 48 applies a pair of externally supplied complementary bi-level clock pulse trains to the gates of FETs 21 and 22. The voltages source 48 applies to the gates of FETs 21 and 22 are such as to change the resistive source drain impedances of FETs 21 and 22 between high and low levels, causing typical peak-to-peak voltage swings of about 300 millivolts to 500 millivolts to occur on lines 18 and 20. Lines 18 and 20 apply bi-level voltage variations that are substantial replicas in amplitude and wave shape of the voltages at terminals 80 and 81 to diodes formed by FETs 27 and 28.

To assist in describing the operation, assume clock wave source 48 applies to the gates of FETs 21 and 22 voltages that are respectively low and high during a first half cycle of clock source 48. The low and high voltages at the gates of FETs 21 and 22 cause the voltages at terminals 80 and 81 to be high (e.g., about 500 millivolts) and low (e.g., about 300 millivolts), respectively. The low voltage at terminal 81 is coupled with some attenuation through line 20 via terminal 64 to the gate of FET 47. Accordingly, FET 47 is forward biased to have a low source drain impedance. Consequently, the voltage at terminal 66 is relatively high. The voltage at terminal 66 is somewhat less than the voltage of rail 90, being limited by the diode action of FET 23, connected between terminal 66 and rail 90.

Simultaneously, FET 25 has a relatively high source drain impedance because the high voltage at terminal 80 is coupled with some attenuation through line 18 to terminal 62 and the drain of FET 25. The relatively high voltage at the drain of FET 25 is only somewhat less than the bias voltage source 172 applies to the gate of FET 25, causing FET 25 to have a relatively high source drain impedance and supply a lower current to terminal 62 than is supplied to terminal 64 during a second half cycle of the clock wave source 48 derives, i.e., when source 48 causes the source drain impedance of FET 21 to be low. During the first half cycle the voltage and currents in FETs 23, 25, 27 and 47 cause voltage drops of about: (1) 0.5 volt across FET 27, (2) 0.5 volt across the source drain path of FET 25, and (3) 0.3 volt across the parallel combination of FETs 23 and 47. Thereby, the voltage at terminal 66 is about 1 volt above ground rail 91.

During the second half cycle of clock source 48, when the source drain impedances of FETs 21 and 22 are respectively low and high, line 20 causes a high voltage of about 0.5 volt to be developed across the diode formed by FET 28, whereby terminal 64 applies a high voltage to the gate of FET 47. The source gate voltage of FET 47 decreases in response to the high voltage at the gate of FET 47, to increase the source drain impedance of FET 47, so the voltage drop across the source drain path of FET 47 increases to about 0.5 volt. The voltage drop across the source drain path of FET 47 is limited by the diode formed by FET 23. Consequently, the current flowing from positive power supply rail 90 to terminal 66 decreases.

Simultaneously, FET 25 has a lower source drain impedance because the low voltage at terminal 80 is coupled with some attenuation through line 18 to terminal 62 and the source of FET 25. FET 25 is now forward biased to a greater extent than during the first half cycle. However, the voltage drop across the source drain path of FET 25 does not change appreciably from one half cycle to the next because the decreased source drain impedance of FET 25 is largely offset by the decreased current flow through,the source drain path of FET 25, resulting from the higher source drain impedance of FET 47. Hence, during the second half cycle, the voltages and currents in FETs 23, 25, 27 and 47 cause voltage drops of about: (1) 0.3 volt across FET 27, (2) 0.5 volt across the source drain path of FET 25, and (3) 0.5 volt across the parallel combination of FETs 23 and 47. Thereby, the voltage at terminal 66 is about 0.8 volt above ground rail 91.

Consequently, the voltage variations at terminal 66 during the two half cycles of source 48 are approximately the same as the voltage variations at terminals 80 and 81. The leading and trailing edges of the voltage variations at terminal 66 occur at substantially the same time, i.e., within about 10 ps, of when the transitions at terminal 80 occur.

Similar, but complementary, operations occur in the transistors of buffer 54 during the first and second half cycles. Hence, while voltages levels of about 1.0 and 0.8 volt occur at terminal 66 of buffer 53 during the first and second half cycles of source 48, voltage levels of about 0.8 and 1.0 volt occur at terminal 68 of buffer 54 during the first and second half cycles.

Since input buffers 53 and 54 always present a low resistive impedance to the output of driver 50, the goal of skew reduction is achieved by the driver and receiver circuits of FIG. 2. More particularly, the complementary clock waves developed at output terminals 66 and 68 of buffers 53 and 54 exhibit minimum clock skew with respect to clock waves developed by source 48 and on other parts of integrated circuit chip 46.

The relative reduction of clock skew achieved by the circuit of FIG. 2 can be shown mathematically. Equation (1), which represents the general equation for the total RC delay in a clock tree segment including driver 50, lines 18 and 20, and receiver 52, can be approximated since the resistive input impedance, Rrcv, receiver 52 presents to lines 18 and 20 is relatively small as compared to the conventional circuit of FIG. 1. For small Rrcv, i.e., between 10 and 50 ohms as previously discussed, the generalized equation approximates to the following:

$$Delay = \frac{R\,int\,C\,int}{2}\left(\frac{Rdr + R\,int/3}{Rdr + R\,int}\right) \qquad \text{Equation (4)}$$

From this approximated RC delay, the clock skew due to small variations of ((Rrcv) in Rrcv and ((Rint) in Rint can be expressed as:

$$Skew = \frac{\delta(R\,int)R\,int\,C\,int}{2}\left(\frac{2/3 * Rdr}{(R\,int + Rdr)^2}\right) \qquad \text{Equation (5)}$$

The reduction of clock skew achieved by the circuit of FIG. 2 relative to that of FIG. 1 is apparent from a comparison of Equations (3) and (5). Since the output resistance Rdr of driver 50 is typically much larger than the resistive impedance Rint of clock wires 18 and 20 connecting driver 50 to receiver 52, the terms in the denominator of Equation (5) represent a quantity that is significantly larger than the quantity represented by the terms in the denominator of Equation (3). Thus, Equation (5) indicates the circuit of FIG. 2 achieves a significant reduction in skew, (e.g., by a factor of 6 or more,) relative to the circuit of FIG. 1. Since the input impedance of receiver 52 is drastically reduced and since receiver 52 is responsive primarily to current variations and relatively small voltage changes at its inputs, receiver 52 is characterized as a current mode receiver or input buffer.

It is desirable to (1) amplify the relatively low clock pulse voltage variations at terminals 66 and 68 to clock pulse voltages that swing almost completely between the DC power supply voltages at rails 90 and 91, and (2) substantially eliminate common mode noise coupled to the clock pulse trains propagating along lines 18 and 20 from driver 50 to receiver 52. Noise removal is especially important in the circuit of FIG. 2 where voltage swings of terminal 66 and 68 are only about 0.2 volt between adjacent half cycles of source 48. Because of these relatively low amplitude variations, the common mode noise coupled to clock lines 18 and 20 can easily adversely affect clock pulse trains derived at output terminals 66 and 68 of buffers 52 and 54. If the relatively low peak-to-peak clock pulse voltage swings at terminals 66 and 68 were to be applied to a conventional complementary inverter, the inverter would have a high likelihood of being triggered by the noise. Consequently, the clock pulses of the clock pulse wave trains would be seriously degraded and perhaps unusable. To avoid this problem, the clock circuitry of FIG. 2 includes amplifier stage 55, responsive to receiver 52. Amplifier stage 55 substantially removes common mode noise present at output terminals 66 and 68 and converts the relatively low voltage swings at terminals 66 and 68 into approximately rail-to-rail voltage swings.

Amplifier stage 55 includes first and second differential amplifiers 56 and 58, both responsive to the clock pulse trains at terminals 66 and 68. Amplifiers 56 and 58 derive complementary clock pulse trains such that when amplifier 56 derives a clock pulse having a voltage almost at the high positive voltage at rail 90, amplifier 58 derives a clock pulse having a voltage almost at ground rail 91 and vice versa.

Differential amplifier 56 includes a pair of N-channel FETs 31 and 32 connected as a differential pair. The gates of FETs 31 and 32 are respectively connected to be responsive to the complementary output voltages at output terminals 68 and 66. N-channel FET 33 has its source-drain path connected between ground rail 91 and a common connection for the sources of FETs 31 and 32. The drain of FET 31 is connected to positive rail 90 through a diode formed by connecting the drain and gate of P-channel FET 29 together to form the diode anode; the diode cathode, corresponding to the source of FET 29, is connected to the positive power supply voltage at rail 90. The common connection of the drain and gate of FET 29 is connected to the drain of N-channel FET 31. The common connection of the drains of FETs 29 and 31 is connected to the gate of N-channel FET 33, having a source drain path connected to the sources of N-channel FETs 31 and 32. The source of FET 33 is connected to ground rail 91, while the drain of FET 33 is connected to the sources of FETs 31 and 32. P-channel FET 30 has a source connected to positive rail 90 and a source drain path in series with the source drain path of N-channel FET 32. The gate of FET 30 is tied to output terminal 72 of amplifier 58, having an output voltage that is complementary to the output of amplifier 56 at terminal 70. Terminal 70 is at the common drain terminals of FETs 30 and 32.

In response to the voltages at terminals 66 and 68 being respectively high and low during the previously described first half cycle of source 48, the source drain paths of FETs 32 and 31 respectively have low and high impedances. Thereby, terminal 84 at the drain of FET 31 is at a high voltage. The diode action of FET 29 prevents the voltage at the drain of FET 31 from reaching the voltage of rail 90. The high voltage at terminal 84 drives the gates of FETs 30 and 33, causing the source drain impedances of FETs 30 and 33 to be relatively high and low, respectively. Thereby, the voltages of the sources of FETs 31 and 32 decrease and the voltage of the drain of FET 32, at output terminal 70, decreases. Simultaneously, current flow from rail 90 through the source drain path of FET 30 decreases to assist in bringing the voltage at output terminal 70 of amplifier 56 toward ground. Simultaneously, differential amplifier 58 output terminal 72 supplies a high voltage to terminal 84 and the gates of FETs 30 and 33, tending to further reduce the voltages at the sources of FETs 31 and 32. The cumulative action is such that the voltage of terminal 70 quickly drops virtually to the ground potential of rail 91 so a negative going transition occurs at terminal 70 within about 110 ps of a negative going transition of clock source 48.

During the previously described second half cycle of clock source 48 when the voltages at terminals 66 and 68 are respectively low and high, FETs 32 30 and 31 respectively have high and low source drain impedances. Simultaneously, output terminal 72 of amplifier 58 applies a low voltage to (1) the gate of FET 30, to turn on FET 30, (2) the gate of FET 33, to turn off FET 33, and (3) the drain of FET 31. The low drain voltage of FET 31 (which is limited to a maximum deviation from the voltage of rail 90 by diode 29) is coupled through the low impedance source drain path of FET 31 to the drain of FET 33 and the source of FET 32. The cumulative action is such that the voltage at terminal 70 quickly rises virtually to the positive power supply terminal at rail 90; the timings of the positive/negative going transitions at terminal 70 relative to the transitions of clock source 48 are about the same.

The operation of differential amplifier 58 in response to positive/negative going transitions at terminals 66 and 68 is exactly as described for differential amplifier 56, except in a complementary manner because N-channel FET 36, in series with the diode-connected P-channel FET 34, is connected to respond to the voltage at terminal 66. N-channel FET 37 is connected in series to rail 90 through the source drain path of P-channel FET 35, having its gate tied to output terminal 70 of amplifier 56. N-channel FET 38 has its source drain path connected between ground rail 91 and the connected sources of FETs 36 and 37.

Differential amplifiers 56 and 58 substantially eliminate common mode noise coupled to leads 18 and 20. The common mode noise has the same polarity and substantially the same amplitude at terminals 66 and 68. These noise components are subtracted by amplifiers 56 and 58 during first half cycles of the clock output of source 48. During the other half cycles of clock source 48, the output voltages of amplifiers 56 and 58 are maintained at the positive power supply voltage of rail 90. Because the outputs of differential amplifiers 56 and 58 are unresponsive to the common mode noise components, the voltages at output terminals 70 and 72 do not change in response to the common mode noise components.

The operation of differential amplifier 56 in response to the common mode noise components is slightly different during opposite first and second half cycles of source 48. During the first half cycles while the source drain paths of FETs 21 and 22 are respectively high and low impedances, the voltages at output terminals 70 and 72 of differential amplifiers 56 and 58 are respectively low and high. The high voltage at terminal 72 turns off FET 30 and turns on FET 33. Consequently, a high impedance is provided through the source drain path of FET 30 so terminal 70 is decoupled from rail 90. The like polarity and amplitude common mode noise components at terminals 66 and 68 supplied to the gates of FETs 31 and 32 are subtracted by amplifier 56 by virtue of the common connection of the sources of FETs 31 and 32 to the drain of FET 33, such that the voltage at terminal 70 is k(A−B) where k is a proportionality constant, A and B are respectively the amplitudes of the voltages of the common mode noise components at the gates of FETs 31 and 32. Since A and B have the same polarity and substantially the same amplitudes, the voltage at terminal 70 is not changed by the common mode noise components.

During the second half cycles of source 48, while the voltages at output terminals 70 and 72 are respectively high and low, the common mode noise components are subtracted in differential amplifier 58, causing the voltage at terminal 72 to be maintained at a low value. The low voltage at terminal 72 is applied to the gate of P-channel FET 30, to turn FET 30 on, causing the power supply voltage at rail 90 to be applied to terminal 70. In addition, during these half cycles, the low voltage of terminal 72 applied to the gate of FET 33 turns off FET 33, to prevent substantial current flow through the source drain path of FET 32, to assist in maintaining the voltage at terminal 70 at the voltage of rail 90. Consequently, during the half cycles of clock source 48 when the source drain impedances of FETs 21 and 22 are respectively low and high, the common mode noise coupled to clock lines 18 and 20 does not affect the high output voltage of amplifier 56.

While there has been described and illustrated one embodiment of the invention, it will be clear that variations in the details of the embodiments specifically illustrated and described may be made without departing from the true spirit and scope of the invention as defined in the appended claims.

What is claimed is:

1. Clock circuitry on an integrated circuit (IC) chip, the clock circuitry being adapted to be responsive to a clock wave source, the clock circuitry comprising:

a driver having an output for deriving an output clock wave in response to the clock wave of the clock wave source;

a clock line having a first end coupled to said output of said driver;

a receiver having an input coupled to a second end of said clock line, said receiver having a resistive input impedance causing said clock line carrying said output clock wave to said input to present to said driver output an impedance having a resistance-capacitance time constant that is a relatively small fraction of a period of the clock wave, said clock line having capacitive and inductive reactances tending to cause oscillations on the clock line in response to clock wave transitions, said resistive input impedance of said receiver having a magnitude to substantially dampen said oscillations.

2. The clock circuitry of claim 1 wherein said resistive input impedance of said receiver is greater than about 10 ohms.

3. The clock circuitry of claim 2 wherein said resistive input impedance of said receiver is less than about 70 ohms.

4. The clock circuitry of claim 1, wherein said resistance-capacitance time constant is less than about 15 percent of the period of the clock wave.

5. The clock circuitry of claim 1, wherein said receiver includes a current source for supplying to said input of said receiver a current that varies in response to a level of clock wave supplied to said input of said receiver by said clock line, said current source being coupled to said input of said receiver to influence the resistive input impedance of the receiver.

6. The clock circuitry of claim 5, wherein said current supplied by said current source to said input of said receiver increases and decreases with respective decreases and increases of the level of said clock wave supplied to said input of said receiver.

7. The clock circuitry of claim 6, wherein said receiver includes a shunt impedance connected between said input of said receiver and one of a pair of power supply lines of the IC chip, said shunt impedance and said current source being arranged to substantially limit the amplitude of the clock wave supplied to said input of said receiver and influence the resistive input impedance of said receiver.

8. The clock circuitry of claim 7, further including an amplification stage coupled to an output of said receiver for deriving an amplified clock wave at an output of said amplification stage, said amplification stage being constructed and arranged for amplifying relatively low amplitude clock wave variations at said output of said receiver to substantially high and low power supply voltages of the IC chip at said output of said amplification stage, said amplified clock wave having clock wave transitions that are (a) low relative to the voltage between the power supply lines, and (b) substantially coincident with clock wave transitions of the clock wave of the clock wave source.

9. Clock circuitry on an integrated circuit (IC) chip, the clock circuitry being adapted to be responsive to a clock wave source, the clock circuitry comprising:

a driver having an output for deriving an output clock wave in response to the clock wave of the clock wave source;

a clock line having a first end coupled to said output off said driver;

a receiver having an input coupled to a second end of said clock line, said receiver having a resistive input impedance causing said clock line carrying said output clock wave to said input to present to said driver output an impedance having a resistance-capacitance time constant that is a relatively small fraction of a period of the clock wave; said driver being arranged to derive first and second complementary clock waves at respective first and second outputs thereof, said receiver including first and second inputs, and said clock line including first and second clock lines connected respectively between said first and second outputs of said driver and said first and second inputs of said receiver, said first and second clock lines being arranged on the IC chip so that noise coupled to one of said first and second clock lines tends to be coupled to the other one of said first and second clock lines, said receiver being constructed and arranged to substantially reject noise of like amplitude and polarity coupled to said first and second inputs thereof by said first and second clock lines.

10. The clock circuitry of claim 9, wherein said receiver includes a noise rejection stage for rejecting said noise of like amplitude and polarity at first and second outputs of the receiver, said noise rejection stage rejecting said noise during alternate first and second portions of each cycle of the clock wave of the clock wave source, said first and second outputs deriving respective first and second complementary clock waves having clock wave transitions substantially coincident with the clock wave transitions of the clock wave of the clock wave source.

11. Clock circuitry on an integrated circuit (IC) chip, the clock circuitry being adapted to be responsive to a clock wave of a clock wave source, the clock circuitry being connected between a pair of DC power supply lines of the IC chip, the clock circuitry comprising:

a driver having an output for deriving clock waves responsive to the clock wave of the clock wave source, said driver being coupled between said output thereof and one of the pair of power supply lines of the IC chip;

a clock line having a first end coupled to said output of said driver; and a receiver having an input coupled to a second end of said clock line, said receiver including a shunt impedance coupled between said input and the one of the pair of power supply lines, said shunt impedance having a resistance approximately equal to an output resistance of said driver, and a current source coupled to said input, said current source being arranged for supplying current to said shunt impedance and through said clock line to said output of said driver.

12. The clock circuitry of claim 11, wherein said shunt impedance and said current source are arranged to cause a clock wave at said input of said receiver to change between bi-levels of the clock wave by an amount that is substantially less than the full voltage between the pair of power supply lines.

13. The clock circuitry of claim 12, wherein the current supplied by said current source increases and decreases responsive to respective decreases and increases of said level of said clock wave at said input of said receiver.

14. The clock circuitry of claim 13, further including a source of a constant voltage coupled to a control input of said current source, said current source, the constant voltage and the clock wave at said input of said receiver being coupled together so the current supplied by said current source increases and decreases responsive to respective amplitude decreases and increases of the clock wave at the input of said receiver relative to the constant voltage.

15. The clock circuitry of claim 13, further including an amplification stage coupled to an output of said receiver for deriving an amplified clock wave at an output of said amplification stage, said amplified clock wave having clock wave transitions substantially coincident with clock wave transitions of the clock wave of the clock wave source, said amplified clock wave having a level varying by an amount substantially equal to the full voltage between the pair of power supply lines.

16. The clock circuitry of claim 11, wherein said driver is arranged for deriving a first clock wave and a complementary second clock wave at respective first and second outputs thereof, said receiver includes first and second inputs, and said clock line includes first and second clock lines connected respectively between said first and second outputs of said driver and said first and second inputs of said receiver, said first and second clock lines being arranged on the IC chip so that noise coupled to one of said first and second clock lines tends to be coupled to the other one of said first and second clock lines, said receiver being constructed and arranged to substantially reject noise of like amplitude and polarity coupled to said first and second inputs thereof by said first and second clock lines.

17. The clock circuitry of claim 11, wherein said shunt impedance and an impedance of said current source contribute to a resistive input impedance of said receiver, said input impedance of said receiver causing said clock line carrying said output clock wave to said input of said receiver to present to said driver output an impedance having a resistance-capacitance time constant that is a relatively small fraction of a period of the clock wave.

18. Clock circuitry on a integrated circuit (IC) chip, the clock circuitry being adapted to be responsive to a clock wave of a clock wave source, the clock circuitry being connected between first and second DC power supply lines of the IC chip, the clock circuitry comprising:

a driver having an output for deriving a clock wave responsive to the clock wave of the clock wave source, said driver including a first transistor having a first current path and an impedance connected between said output and the first power supply line, said first transistor including a first control electrode responsive to the clock wave of the clock wave source for controlling the impedance of said first current path;

a clock line having a first end connected to said output; and a receiver having an input connected to a second end of said clock line, said receiver including a first device, configured as a diode, and connected between said input and the first power supply line, said device respectively conducting and non-conducting responsive to a clock wave voltage at said input having relatively high and low levels;

a second device, configured as a diode, and connected between an output of said receiver and the second power supply line, said second device respectively conducting and non-conducting responsive to a voltage at said output having relatively low and high levels;

a second transistor including a second current path and an impedance connected in parallel with said second device, said second transistor including a second control electrode for driving the impedance of said second current path relatively high and low when said second device is respectively conducting and non-conducting; and a third device, configured as a current source, and connected between said input and said output of said receiver, said third device including a control input for controlling the current supplied by said current source to said input.

19. The clock circuitry of claim 18, wherein the first device configured as a diode includes a resistive impedance substantially equal to a resistive output impedance of said driver.

20. The clock circuitry of claim 18, wherein said second device configured as a diode and said current source are arranged to substantially limit the amplitude of a clock wave at said input of said receiver and influence the resistive input impedance of the receiver.

21. The clock circuitry of claim 18, further including a source of a constant voltage coupled to said control electrode of said current source, said current source, the constant voltage and the clock wave voltage at said input of said receiver being coupled together so the current supplied by said current source increases and decreases responsive to respective amplitude decreases and increases of the clock wave voltage at the input of said receiver relative to the constant voltage.

22. The clock circuitry of claim 18, wherein said receiver includes a complementary input connected to said second control electrode for deriving a voltage complementary to a voltage at said input of said receiver connected to said clock line, said second current path impedance being driven to relatively high and low impedances during alternate first and second portions of each cycle of the clock wave of the clock wave source.

23. The clock circuitry of claim 22, wherein said first device configured as a diode includes a transistor having a current path connected between said input and the first DC power supply line, said second device configured as a diode includes a transistor having a current path connected between said output of receiver and the second DC power supply line, and said third device configured as a constant current source includes a transistor having a current path connected between said input and output of said receiver.

24. The clock circuitry of claim 23, wherein each of said first transistor of said driver, said transistor of said first device configured as a diode, and said transistor of said third device configured as a current source is a field effect transistor (FET) having a channel of a first conductivity type, and each of said second transistor and said transistor of said second device is a FET having a channel of a second conductivity type.

25. The clock circuitry of claim 18, further including an amplification stage coupled to said output of said receiver for deriving an amplified clock wave, said amplified clock wave having clock wave transitions substantially coincident with clock wave transitions of the clock wave of the clock wave source, and said amplified clock wave having a level varying by an amount substantially equal to the full voltage between the first and second DC power supply lines.

26. The clock circuitry of claim 18, wherein said driver derives a first clock wave and a complementary second clock wave at respective first and second outputs thereof, said receiver includes first and second inputs, and said clock line includes first and second clock lines connected respectively between said first and second outputs of said driver and said first and second inputs of said receiver, said first and second clock lines arranged on the IC chip so that noise coupled to one of said first and second clock lines tends to be coupled to the other one of said first and second clock lines, said receiver being constructed and arranged to substantially reject noise of like amplitude and polarity coupled to said first and second inputs thereof by said first and second clock lines.

27. The clock circuitry of claim 18, wherein a resistive impedance of said clock line and an input impedance of said receiver cause said clock line carrying said output clock wave to said input of said receiver to present to said output of said driver a resistive impedance having a resistance-capacitance time constant that is a relatively small fraction of a cycle of the clock wave of the clock wave source.

28. Clock circuitry on an integrated circuit (IC) chip, the clock circuitry being adapted to be in response to a clock wave of a clock wave source, the clock circuitry being connected between first and second DC power supply lines of the IC chip, the clock circuitry comprising:

a driver having an output for deriving a clock wave in response to the clock wave of the clock wave source, said driver including a transistor having (a) a first current path and (b) an impedance connected between said output and the first power supply line, said transistor including a control electrode connected to be responsive to the clock wave of the clock wave source for controlling the impedance of said first current path;

a clock line having a first end connected to said output; and a receiver having an input connected to a second end of said clock line, said receiver including a conducting path having (a) a first impedance between the receiver input terminal and the first power supply line, and (b) a second impedance between the receiver input terminal and the second power supply line; the receiver, the line and the driver being connected so that the only current which flows through the first current path and the impedance of the transistor flows between the first and second power supply lines via (a) the second impedance, (b) the receiver input terminal, and (c) the clock line.

29. The clock circuitry of claim 28 wherein said clock line has capacitive and inductive reactances tending to cause oscillations on the clock line in response to clock wave transitions, and the second impedance of said receiver has a resistive magnitude to substantially dampen said oscillations.

30. The clock circuitry of claim 29 wherein said receiver loads the clock line with an impedance causing the clock line to present to said driver output an impedance having a resistance-capacitance time constant that is a relatively small fraction of a period of the clock wave.

31. The clock circuitry of claim 30, wherein said receiver includes a current source for supplying to said input of said receiver and said line and first current path a current that varies in response to a level of the clock wave supplied to said input of said receiver by said clock line, said current source being coupled to said input of said receiver to influence the resistive input impedance of the receiver.

32. The clock circuitry of claim 28, wherein said receiver includes a current source for supplying to said input of said receiver and said line and first current path a current that varies in response to a level of clock wave supplied to said input of said receiver by said clock line, said current source being coupled to said input of said receiver to influence the resistive input impedance of the receiver.

33. The clock circuitry of claim 32, wherein the driver, clock line, receiver and the current source are arranged and connected so that substantial non-zero currents flow through the first current path during all portions of a clock wave cycle.

34. The clock circuitry of claim 32, wherein the clock wave source is arranged to derive plural successive clock cycles, and each clock cycle includes complementary first and second half cycles so that during the first and second half cycles the clock wave has relatively high and low values respectively; the driver, clock line, receiver and current source being arranged and connected so that during the first and second half cycles relatively high and low substantial non-zero currents respectively flow through the first current path.

35. The clock circuitry of claim 18, wherein the receiver includes a conducting path between the DC power supply lines, the conducting path including a first impedance between the receiver input terminal and the first power supply line and a second impedance between the receiver input terminal and the second power supply line; the receiver, the line and the driver being connected so that the only current which flows through the first current path and the impedance of the first transistor flows between the first and second power supply lines via (a) the first impedance, (b) the receiver input terminal, and (c) the clock line.

36. Clock circuitry on an integrated circuit (IC) chip, the clock circuitry being adapted to be responsive to a clock wave of a clock wave source, the clock circuitry comprising:

a driver having an output for deriving an output clock wave in response to the clock wave of the clock wave source, said driver being arranged for deriving a first clock wave and a complementary second clock wave at respective first and second outputs thereof, a clock line having a first end coupled to said output of said driver; and a receiver having an input coupled to a second end of said clock line, said receiver including first and second inputs;

said clock line including first and second clock lines connected respectively between said first and second outputs of said driver and said first and second inputs of said receiver, said first and second clock lines being arranged on the IC chip so that noise coupled to one of said first and second clock lines tends to be coupled to the other one of said first and second clock lines, said receiver being constructed and arranged to substantially reject noise of like amplitude and polarity coupled to said first and second inputs thereof by said first and second clock lines.

37. Clock circuitry on an integrated circuit (IC) chip, the clock circuitry being adapted to be responsive to a clock wave of a clock wave source, the clock circuitry being connected between first and second DC power supply lines of the IC chip, the clock circuitry comprising:

a driver having first and second outputs for respectively deriving first and second complementary clock waves responsive to the clock wave of the clock wave source;

a receiver having first and second inputs;

first and second clock lines respectively connected between said first and second outputs of said driver and said first and second inputs of said receiver, said first and second clock lines being arranged on the IC chip so that noise coupled to one of said first and second clock lines tends to be coupled to the other one of said first and second clock lines, said receiver being constructed and arranged to substantially reject the noise of like amplitude and polarity coupled to said first and second inputs thereof by said first and second clock lines.

38. The clock circuitry of claim 37, wherein said receiver includes a noise rejection stage arranged to reject the noise of like amplitude and polarity, said noise rejection stage being arranged for rejecting said noise at (a) the first output only during a first portion of each cycle of the clock wave and (b) the second output only during a second portion of each cycle of the clock wave, said first and second outputs being arranged for respectively deriving first and second complementary clock waves having clock wave transitions substantially coincident with the clock wave transitions of the clock wave.

39. The clock circuitry of claim 37, wherein received clock waves respectively supplied to said first and second inputs of said receiver by said first and second clock lines have an amplitude substantially less than the full voltage between the DC power supply lines, said receiver including an amplification stage for amplifying the received clock waves to an amplitude substantially equal to the full voltage between the DC power supply lines.

40. The clock circuitry of claim 37, wherein said receiver includes first and second differential amplifiers having substantially the same configuration, each having first and second signal input terminals connected to be responsive to third and fourth complementary waves that are respectively substantial replicas of complementary clock waves at the first and second inputs of the receiver, the differential amplifiers being constructed so that opposite half cycles of a single clock wave cycle are processed differently from each other therein, the first and second signal input terminals of the first differential amplifier being respectively connected to be responsive to the third and fourth waves to derive a first difference signal determined by the amplitude of the third wave minus the amplitude of the fourth wave, the first and second signal input terminals of the second differential amplifier being respectively connected to be responsive to the fourth and third waves to derive a second difference signal determined by the amplitude of the fourth wave minus the amplitude of the third wave, and circuitry for combining the first and second difference signals to derive a clock wave that is a substantial replica of the clock wave of the clock wave source, without the noise.

41. The clock circuitry of claim 40, wherein each of the differential amplifiers includes first, second and third transistors having the same first conductivity type, fourth and fifth transistors having the same second conductivity type, each of the transistors including a control electrode and a path having an impedance controlled by voltage at the control electrode, the paths of the first and fourth transistors being connected in series to form a first branch, the paths of the second and fifth transistors being connected in series to form a second branch, one end of each of the first and second branches being connected to a first power supply terminal, a second end of each of the first and second branches being connected to the path of the third transistor, the control electrodes of the first and second transistors of the first differential amplifier being connected to be respectively responsive to the third and fourth waves, the control electrodes of the first and second transistors of the second differential amplifier being connected to be respectively responsive to the fourth and third waves.

42. The clock circuitry of claim 41, wherein the control electrodes of the third, fourth and fifth transistors of each of the differential amplifiers are connected together, and the fourth transistor of each of the differential amplifiers is connected as a diode.

43. The clock circuitry of claim 42, wherein a terminal between the paths of the first and fourth transistors of the first amplifier is connected to be at the same potential as a terminal between the paths of the second and fifth transistors of the second amplifier and a terminal between the paths of the first and fourth transistors of the second amplifier is connected to be at the same potential as a terminal between the paths of the second and fifth transistors of the first amplifier.

44. The clock circuitry of claim 40, wherein the differential amplifiers are arranged and connected to each other to be responsive to the third and fourth waves so that (a) during first half cycles of the clock source the first differential amplifier subtracts the noise components of the third and fourth a waves, (b) during second half cycles of the clock source the first differential amplifier supplies a power supply voltage to an output terminal of the first differential amplifier, (c) during the second half cycles of the clock source the second differential amplifier subtracts the noise components of the third and fourth waves, and (d) during the first half cycles of the clock source the second differential amplifier supplies a power supply voltage to an output terminal of the second differential amplifier.

45. The clock circuitry of claim 40, wherein the receiver includes a differential amplifier having first and second input terminals respectively connected to be responsive third and fourth complementary waves that are substantial replicas of complementary clock waves at the first and second inputs of the receiver, the differential amplifier being arranged and connected to be responsive to the third and fourth waves so that during first half cycles of the clock source the differential amplifier subtracts the noise components of the third and fourth waves and during second half cycles of the clock source the differential amplifier supplies a power supply voltage to an output terminal of the differential amplifier.

46. The clock circuitry of claim 28 wherein the first impedance is of a type to establish a predetermined voltage between the receiver input terminal and the first power supply line substantially independent of the current flowing through the first impedance.

47. The clock circuitry of claim 46 wherein the first impedance includes a device having a pair of electrodes configured to effectively form a diode biased by current flowing from the second power supply line to the receiver input terminal via the second impedance.

48. The circuitry of claim 11 in combination with a clock source connected to the driver input.

49. The circuitry of claim 28 in combination with a clock source connected to the transistor control electrode.

50. The circuitry of claim 36 in combination with a clock source, the driver being arranged to derive the first and second clock waves in response to the clock source.

51. The circuitry of claim 37 in combination with a clock source, the driver being arranged to derive the first and second clock waves in response to the clock source.

52. The circuitry of claim 11 wherein the clock line has a length of about 400 micrometers.

53. The circuitry of claim 28 wherein the clock line has a length of about 400 micrometers.

54. The circuitry of claim 36 wherein each of the clock lines has a length of about 400 micrometers.

55. The circuitry of claim 37 wherein each of the clock lines has a length of about 400 micrometers.

* * * * *

UNITED STATES PATENT AND TRADEMARK OFFICE
CERTIFICATE OF CORRECTION

PATENT NO. : 6,433,605 B1  Page 1 of 1
DATED : August 13, 2002
INVENTOR(S) : Johnny Q. Zhang It is certified that error appears in the above-identified patent and that said Letters Patent is hereby corrected as shown below:

Column 14,
Line 18, delete "off" and insert therefor -- of --

Signed and Sealed this

Sixth Day of July, 2004

JON W. DUDAS
*Acting Director of the United States Patent and Trademark Office*